United States Patent [19]
Lavan

[11] Patent Number: 6,061,250
[45] Date of Patent: May 9, 2000

[54] FULL ENCLOSURE CHASSIS SYSTEM WITH TOOL-FREE ACCESS TO HOT-PLUGGABLE CIRCUIT BOARDS THEREIN

[75] Inventor: Thomas John Lavan, Lafayette, Colo.

[73] Assignee: Adaptec, Inc., Milpitas, Calif.

[21] Appl. No.: 08/882,170

[22] Filed: Jun. 25, 1997

[51] Int. Cl.[7] ..................................................... H05K 7/14
[52] U.S. Cl. ......................... 361/797; 361/686; 361/727; 361/752; 361/753; 361/801
[58] Field of Search ..................... 361/683, 684, 361/685, 686, 726, 727, 731, 732, 735, 736, 740, 741, 747, 748, 752–756, 759, 788, 797, 798, 801, 802

[56] References Cited

U.S. PATENT DOCUMENTS

| | | | |
|---|---|---|---|
| 5,379,184 | 1/1995 | Barraza et al. | 361/685 |
| 5,398,161 | 3/1995 | Roy | 361/727 |
| 5,717,570 | 2/1998 | Kikinis | 361/685 |
| 5,721,669 | 2/1998 | Becker et al. | 361/685 |
| 5,790,374 | 8/1998 | Wong | 361/685 |
| 5,822,184 | 10/1998 | Rabinovitz | 361/685 |

FOREIGN PATENT DOCUMENTS

| | | | |
|---|---|---|---|
| 2 276 275 | 9/1994 | United Kingdom | 361/685 |

*Primary Examiner*—Leo P. Picard
*Assistant Examiner*—Jayprakash N. Gandhi
*Attorney, Agent, or Firm*—Duft, Graziano & Forest, P.C.

[57] ABSTRACT

A full enclosure chassis system with tool-free access to hot-pluggable circuit boards therein. The system includes a front access plate that can be opened and closed from the front of a primary chassis when mounted within a secondary chassis so that only the front access panel is externally accessible. When the front access plate is in an open position, circuit boards within the full enclosure chassis system can be hot-pluggably removed and inserted without powering down the system or disrupting any component of the system. The full enclosure chassis system supplies standard connector access to components external to the system by way of standard connectors off the backplane at the back panel of the system. No tools are required to open and close the front access plate or to remove and insert a circuit board from within the system.

7 Claims, 3 Drawing Sheets

FULL ENCLOSURE CHASSIS SYSTEM WITH TOOL-FREE ACCESS TO HOT-PLUGGABLE CIRCUIT BOARDS THEREIN

FIELD OF THE INVENTION

This invention relates to the field of circuit board chassis systems, and in particular to a full enclosure chassis having tool-free access to hot-pluggable circuit boards within the enclosed chassis for replacing at least one hot-pluggable circuit board without interrupting service provided by the remaining components within the full enclosure chassis.

PROBLEM

One of the standard form factors for a secondary chassis in the Personal Computer (PC) industry is comprised of a sheet metal enclosure that houses a standard Alternating Current-Direct Current (AC/DC) power supply and at least one 5.25" wide and 1.6" high single unit height slot. A variety of computing devices are designed to fit within the slots of a secondary chassis in either the single unit height slot or a double unit height slot that is about 3" high. A computing device can be installed into either a single unit height or a double unit height slot from the front of a secondary chassis that has its outside covering removed. Common examples of single unit height computing devices include, but are not limited to, hard disk drives, tape drives, and Compact Disk (CD) drives. A common example of a double unit height computing device includes, but is not limited to, a controller for a Redundant Array of Independent Disks (RAID). A computing device in either a single unit height or double unit height slot are typically enclosed to varying degrees within their own primary chassis.

Low-end secondary chassis are among the highest volume segments of the secondary chassis market. Low-end secondary chassis are typically characterized by a sheet metal exterior containing at least one standard AC/DC power supply and about 6–8 single unit height slots arranged vertically on a narrow footprint "tower" configuration that is substantially 5.25" wide and at or about twice as deep. However, low-end secondary chassis are also characterized by the lack of internal backplanes to service computing devices such as device controllers and other unique circuits among the 6–8 single unit height slots. Providing backplanes for each type of device is not done because it makes the secondary chassis very expensive to manufacture. For this reason, controller configurations such as the double unit height RAID controller for example, are individually housed in their own fully enclosed chassis known as a primary chassis or "cannister" so that the manufacturer of a given computing device can supply any necessary internal backplanes within the primary chassis itself.

The internal configuration of a primary chassis is unique from application to application. The typical configuration contains a back panel opposite a front control panel, and four remaining rectangular panels of sheet metal that are connected together typically by set screws to complete the full enclosure. One of the four rectangular panels sometimes includes a cooling fan. The side panels of the enclosure have a standard spacing of mounting screw receptacles for use in securing each primary chassis to a bracket within the standard form factor secondary chassis. Access to existing primary chassis is available only by removing the set screws from at least one of the four rectangular panels, typically the top panel, so that the panel can be removed. From within a primary chassis, a RAID controller for example can connect to and control an array of hard disk drives installed in the same secondary chassis by way of standard Small Computer System Interface (SCSI) parallel cables or any other desired interface and cables.

A desirable feature of device controllers in a primary chassis, such as RAID controllers, is a dual controller configuration that supports controller failover. Controller failover is a fault tolerant feature designed to prevent an interruption in service should one of the two controllers fail. Types of controller failover configurations include, but are not limited to, active/passive failover and active/active failover. Active/passive failover is a configuration where a first controller is active while the second controller is powered up as a hot standby but not actively in service. In the event the first controller fails, the second controller is ready to begin service. Active/active failover is a configuration where both controllers are actively in service in a shared-service capacity. In the event one of the controllers should fail, the other controller picks up the entire load of service being provided. In the context of a RAID controller, a controller failover configuration insures that a host system will have continuous uninterrupted access to data stored in the RAID array even if a controller failure occurs.

One problem with controller failover implementations in existing fully enclosed chassis systems is that although the host system enjoys continuous uninterrupted access to data in the event of a controller failure, the only way to replace the failed controller is to power down the system. The reason the system must be powered down is because the secondary chassis must be opened so that the primary chassis containing the dual controllers can be removed from its mounting in the secondary chassis. The primary chassis must then be opened so that the failed controller can be removed and replaced before the entire primary and secondary chassis configuration is put back together again. To open an existing primary chassis, several set screws must be removed before at least one panel including typically the top panel of the chassis can be removed. Although the existing procedure to replace a failed controller can be performed in a matter of minutes at a pre-scheduled time, the entire RAID system is inaccessible during the replacement process. Further, if the replaced controller does not function properly once the RAID system is powered up again, the entire process must be repeated.

For these reasons, existing fully enclosed primary chassis systems are undesirable for use with device controllers in controller failover configurations because downtime is required to replace a failed controller. A solution to this problem has heretofore not been disclosed or claimed as set forth below.

SOLUTION

The above identified problems are solved and an advancement made in the field by the full enclosure chassis system of the present invention. The full enclosure chassis system is a primary chassis that includes an openable front panel and a hot-pluggable internal backplane. The openable front panel is accessible from outside the secondary chassis and no tools are needed to open the front panel and no disassembling is required for either the primary or secondary chassis. Once the front panel is open, circuit boards inside the primary chassis can be removed from and inserted into a hot-pluggable internal backplane by way of standard tool-free latches on the circuit boards.

In one embodiment, the openable front panel is a hinged front panel that is opened by disengaging at least one tool-free mechanism on the front panel itself.

In another embodiment, the openable front panel is a fully removable front panel that is removed by disengaging at least one tool-free mechanism on the front panel itself.

In a preferred embodiment, the device controller is a RAID controller with controller failover, a hot-pluggable backplane, a front panel that is hinged along a wide edge of the primary chassis, and visual indicia are present on each controller circuit board therein to distinguish a failed controller from an active controller.

DETAILED DESCRIPTION

Figure 1:
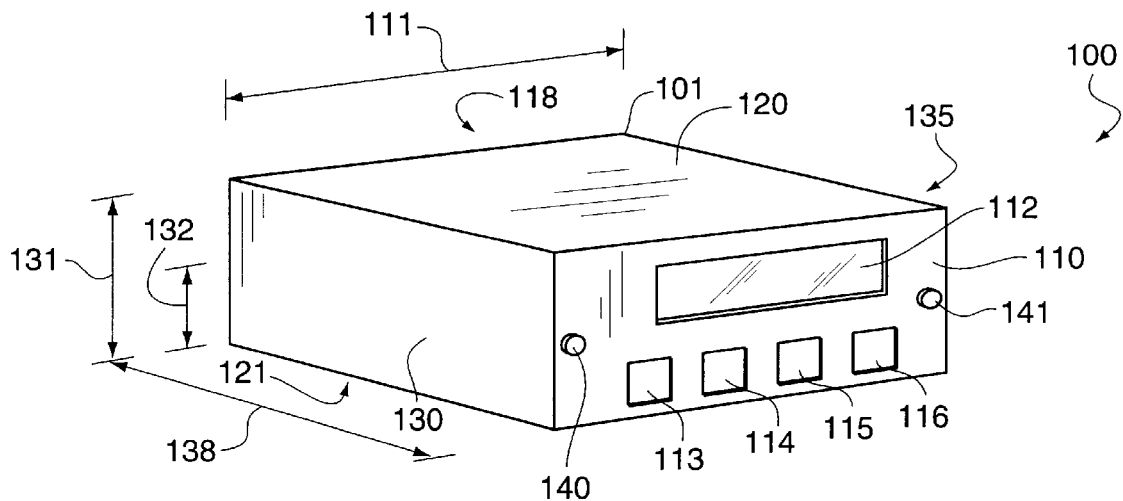
FIG. 1 illustrates a three-dimensional frontal perspective of the full enclosure chassis system with the access plate in a closed position.
Figure 2:
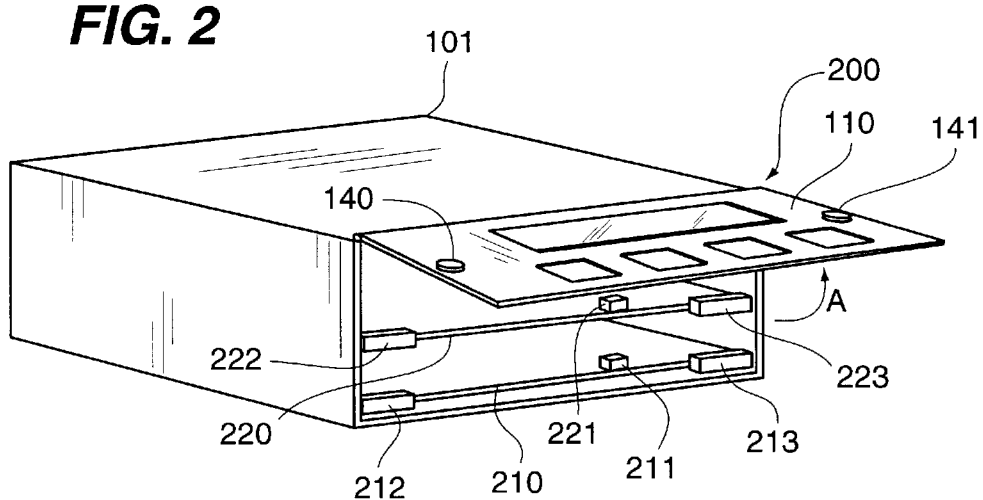
FIG. 2 illustrates a first embodiment of the system in FIG. 1 with the access plate in an open position.
Figure 3:
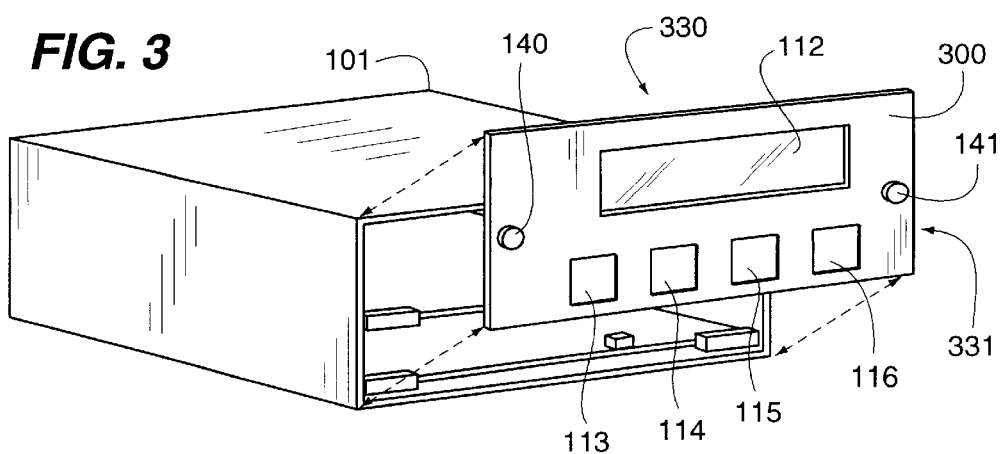
FIG. 3 illustrates a second embodiment of the system in FIG. 1 with the access plate in an open position.

Full Enclosure Primary Chassis—FIGS. 1–3

FIG. 1 illustrates a three-dimensional frontal perspective of the full enclosure chassis system 100 of the present invention in the form of a primary chassis 101 with a front access plate 110 in a closed position. The full enclosure chassis system 100 is 5.25" wide 111, at or about 8"–10" deep 138, and can be either a single unit height 132 or double unit height 131. The front access plate 110 can, but is not required to include, a display 112 and at least one control button 113–116 used to manipulate the display 112. Types of control buttons 113–116 can include, but are not limited to, flat surface membrane buttons, mechanical push buttons, and other switches.

The six surfaces of the primary chassis 101 include a front access plate 110 and a parallel and opposite back surface 118, a top surface 120 and a parallel and opposite bottom surface 121, and a first side surface 130 and a parallel and opposite second side surface 135. The back surface 118 includes industry standard communication and power connections that are not illustrated. Examples of industry standard communication or interface connectors can include, but are not limited to, SCSI, Serial Storage Architecture (SSA), fiber channel, and IDE. In the preferred embodiment, the back surface 118 includes standard SCSI interface communication connections.

Closure devices 140 and 141 are tool-free mechanisms that are operable to engage front access plate 110 in a closed position or to disengage so that front access plate 110 can be opened. In one embodiment, the closure devices are finger operated screws. In alternative embodiments, the closure device or devices can be a tool-free mechanism such as a latch, lever, push release button, or any other tool-free device or mechanism that holds front access plate 110 in a closed position until the mechanism or device is disengaged.

FIG. 2 illustrates the primary chassis 101 as disclosed in the text accompanying FIG. 1, in addition to the front access plate 110 in an open position. The open position occurs by disengaging closure devices 140 and 141 and moving the front access plate 110 in direction A about hinge 200 as the rotational axis. Alternatively, hinge 200 can be located on any edge of front access plate 110 that is desired. When front access plate 200 is in the open position, a first circuit board 210 and a second circuit board 220 are readily accessible to a maintenance person without removing any other cover of primary chassis 101.

The first and second circuit boards 210 and 220 include a first and second visual indicia 211 and 221 respectively to distinguish between a failed circuit board and an active circuit board. The first and second visual indicia 211 and 221, also known as failure annunciators, can be made to show through or extend through front access plate 110 so that a failed or active circuit board can be identified from outside the primary chassis 101 with the front access plate 110 in a closed position. The first and second circuit boards 221 and 220 each have at least one tool-free card extraction lever 212 and 222 respectively and can have a second tool-free card extraction lever 213 and 223 respectively as needed to safely insert and remove a given circuit board. In a preferred embodiment, the first and second circuit boards 210 and 220 are dual RAID controllers in a controller failover configuration.

FIG. 3 illustrates the primary chassis 101 as disclosed in the text accompanying FIG. 1, in addition to a removable front access plate 300 in a removed position. The removed position occurs by disengaging closure devices 140 and 141 and removing the removable front access plate 300 from the main body of the primary chassis 101. The disengaging action is accomplished by way of tool-free release mechanisms on the accessible surface of the removable front access plate 300. Electrical contacts that support data communication to and from the display 112 and the flat surface membrane switches 113–116 are located as needed along the inner surface 330 and/or along the perimeter 331 of the removable front access plate 300.

Figure 4:
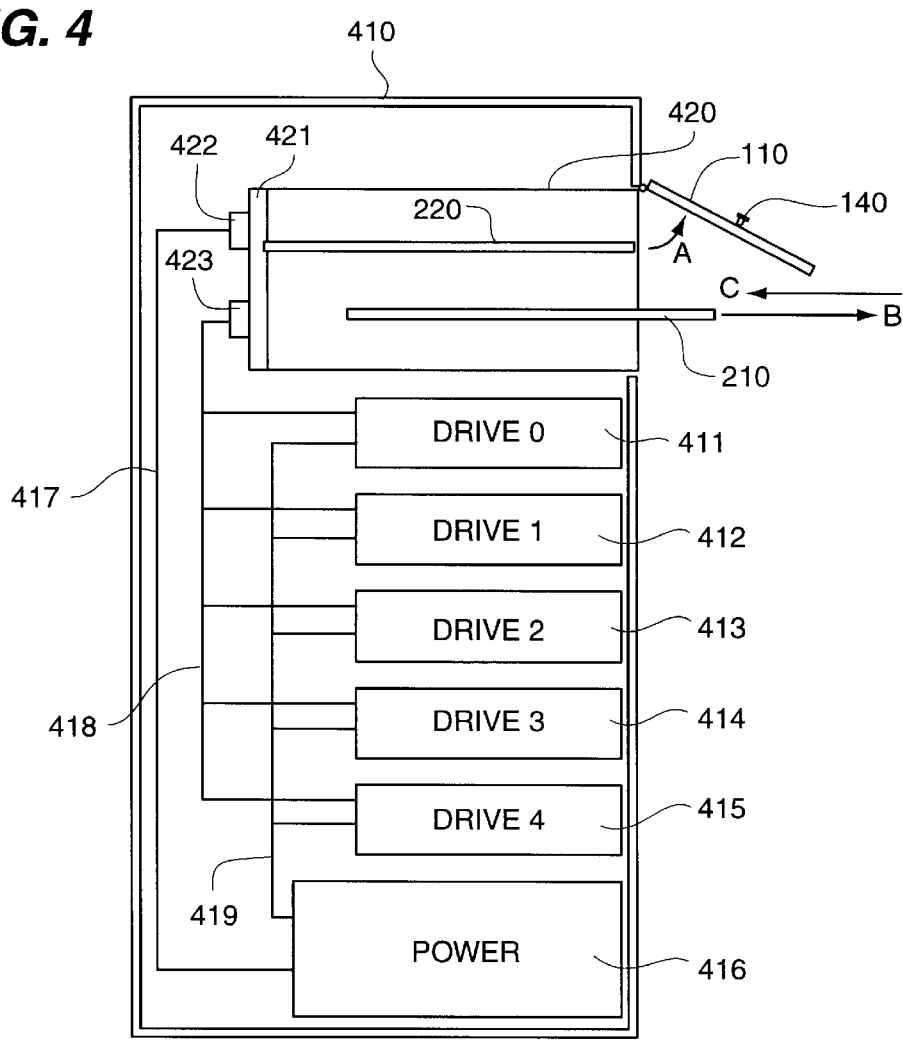
FIG. 4 illustrates an exposed side perspective of a secondary "tower" chassis containing the full enclosure chassis system.

Primary & Secondary Chassis Configuration—FIG. 4

FIG. 4 illustrates a side exposure perspective of a primary chassis 420 and secondary chassis 410 that are configured for a RAID controller system. The use of a RAID system is for example purposes only and should not be taken as a limitation on the applicability of the present invention. However, the preferred embodiment of the full enclosure chassis system of the present invention includes a dual controller failover configuration in a RAID controller system.

The primary chassis 420 is the full enclosure chassis system of the present invention and the secondary chassis 410 is a tower chassis commonly used in the industry. The secondary chassis 410, for example purposes only, includes at least one power supply 416, a plurality of disk drives 411–415, and the primary chassis 420 of the present invention. The at least one power supply 416 supplies power to the plurality of disk drives 411–415 by way of power input lead 419, and to primary chassis 420 by way of primary chassis power input lead 417 connected to primary chassis power port 422. Communications to and from the plurality of disk drives 411–415 by way of interface 423 and cabling 418 to each of the disk drives 41–415 respectively. The primary chassis 420 can be made to accommodate any industry standard or custom interface desired. A SCSI interface is used as the interface in the preferred embodiment.

Primary chassis 420 illustrates the front access plate 110 in an open position with a first circuit board 220 in contact with the internal backplane 421 and a second circuit board 210 being partially removed from the primary chassis 420. The direction of opening the front access plate 110 is direction A and the direction of the second circuit board 210 removal is in direction B. The internal backplane 421 supports hot-pluggable board insertion of a circuit board such as the second circuit board 210 if the board were being inserted in direction C toward backplane 421. Hot pluggable board insertion itself is a well known circuit board and backplane implementation that permits the insertion of a circuit board into a live powered backplane without the inserted board disrupting activity on the backplane or physically damaging the inserted board or the backplane. It is the tool-free access to the hot-pluggable circuit boards without requiring a powerdown of the system that is central to the present invention.

Figure 5:
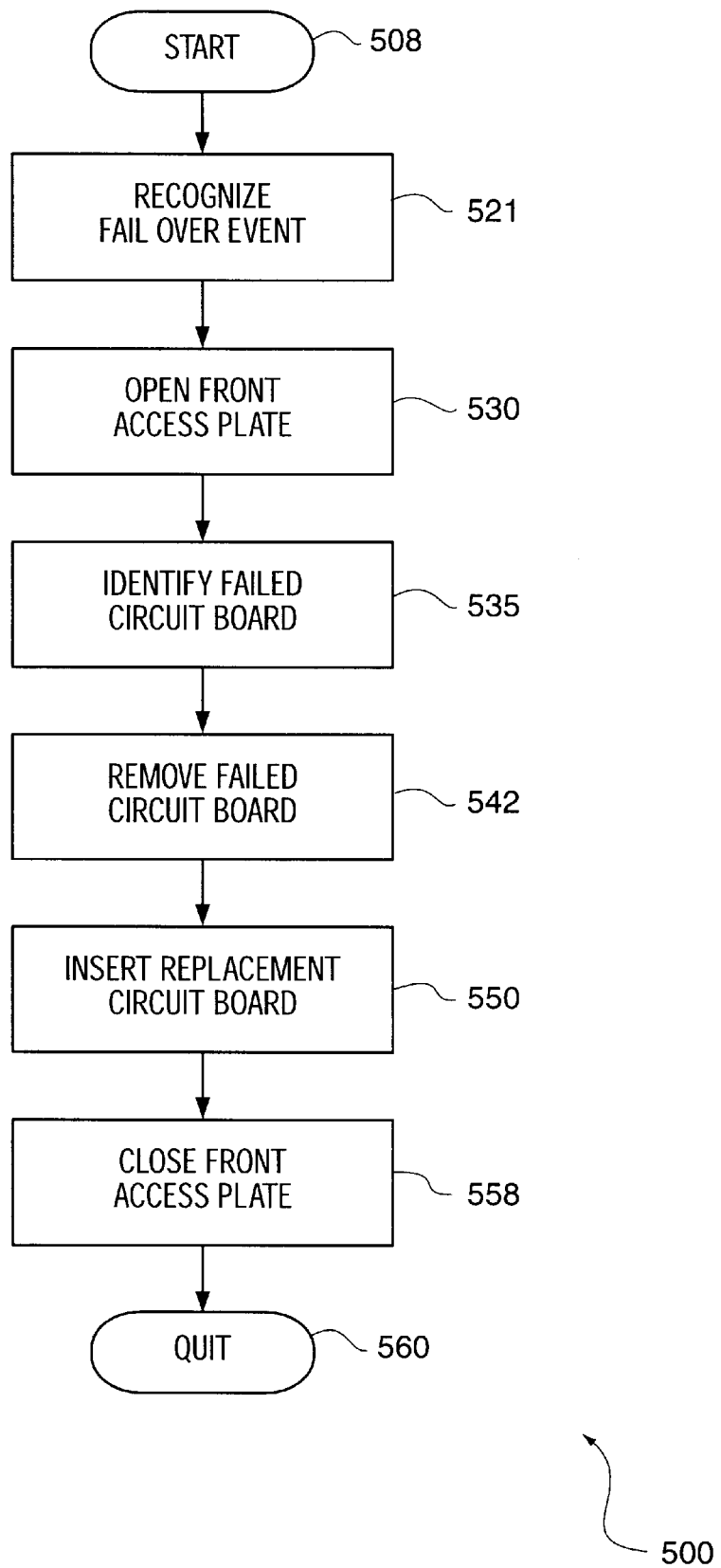
FIG. 5 illustrates operational steps in flow diagram form for using the full enclosure chassis system.

Operational Steps—FIG. 5

FIG. 5 illustrates operational steps 500 in flow diagram form for using the full enclosure chassis system 100 of the present invention. The operational steps 500 begin at step 508 and proceed to step 521 where it must be recognized that a controller failover event has occurred. Recognizing that a controller failover event has occurred can result from an error message on the display 112 of the front access panel 110 or by any other error communication or error logging means as previously discussed in the text accompanying FIG. 2.

Once the controller failover event is recognized as having occurred, there is a failed circuit board in the primary chassis 101 that must be replaced. To replace the failed circuit board, the front access panel 110 must be opened at step 530. Opening the front access panel 110 is accomplished by manipulating a tool-free mechanism on the front access panel itself as previously disclosed in the text accompanying FIG. 2 and/or FIG. 3. Once the front access panel 110 is open, the failed circuit board can be re-identified at step 535 by visual confirmation of the visual indicia such as visual indicia 211.

At step 542, the failed circuit board is removed by manually manipulating the tool-free card extraction levers, such as levers 212 and/or 213 for example, and withdrawing the failed circuit board from within the primary chassis 101. When the failed circuit board is completely removed, a replacement circuit board is hot-pluggably inserted into the internal backplane 421 of the primary chassis 101 at step 550 in an opposite manner as disclosed above for the removal process, all without powering down the primary chassis 101 during the removal or insertion process.

At step 558, the front access plate 110 is closed and the tool-free mechanism to keep the front access plate 110 closed is reengaged to keep the access plate securely in place. The replacement process is complete at step 560.

Summary

The full enclosure chassis system of the present invention includes a front access plate that is accessible from the front of a primary chassis that is mounted within a secondary chassis. The front access plate can be opened and closed to allow external access to at least a first circuit board and/or a second circuit board therein. The first circuit board and second circuit board are both hot-pluggable into an internal backplane within the primary chassis so that either one of the circuit boards can be removed and inserted one at a time without powering down the primary chassis or disrupting the service provided by either circuit board or any other component within the primary chassis. Although specific embodiments of the present invention are disclosed herein, it is expected that persons skilled in the art can and will design alternative full enclosure chassis systems with tool-free access to hot-pluggable circuit boards therein, in a manner that is within the scope of the following claims either literally or under the Doctrine of Equivalents.

What is claimed is:

1. A system enclosing a processing system comprising:

a secondary chassis having a front wall with an opening, a back wall, a top wall, a bottom wall, a first side wall and a second side wall;

a primary chassis having a front side with an access opening, a backside, a bottom side, a top side, a first side, and a second side wherein said primary chassis is inserted into said opening of said secondary chassis with said access opening in said front side being accessible via said opening in said secondary chassis;

a plurality of peripheral devices enclosed inside said secondary chassis;

at least one controller of said processing system enclosed in said primary chasis that controls transfers of data between said plurality of peripheral devices wherein said at least one controllers are accessible through said access opening;

a bus inside said secondary chassis that connects said plurality of peripheral devices to said at least one controller; and a back plane in said back side of said primary chassis that connects said at least one controllers to said bus and allows said at least one controllers to be hot-pluggable into said bus.

2. The system of claim 1 further comprising:

an access plate affixed to said front side of said primary chassis.

3. The system of claim 2 wherein said access plate is movable between an open position for allowing access to said at least one controllers and a closed position for preventing access to said at least one controllers.

4. The system of claim 2 further comprising:

closure devices to move said access plate between an open position and a closed position.

5. The system of claims 2 further comprising:

displays in said access plate that indicate when one of said at least controllers fail.

6. The system of claim 1 wherein each of said at least one controllers comprise:

a tool-free extraction lever that is used to insert and remove said at least one controllers.

7. The system of claim of claim 1 further comprising:

a power supply enclosed in said secondary chassis and connected to said bus that supplies power to said plurality of disk drives and to said at least one controllers.

* * * * *